United States Patent
Ma et al.

(10) Patent No.: US 8,404,533 B2
(45) Date of Patent: Mar. 26, 2013

(54) METAL GATE TRANSISTOR AND METHOD FOR FABRICATING THE SAME

(75) Inventors: Cheng-Yu Ma, Tainan County (TW); Wen-Han Hung, Kaohsiung (TW); Ta-Kang Lo, Taoyuan County (TW); Tsai-Fu Chen, Hsinchu (TW); Tzyy-Ming Cheng, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 137 days.

(21) Appl. No.: 12/860,939

(22) Filed: Aug. 23, 2010

(65) Prior Publication Data

US 2012/0045880 A1 Feb. 23, 2012

(51) Int. Cl.
 *H01L 21/338* (2006.01)
(52) U.S. Cl. ........ 438/199; 438/183; 438/216; 438/591; 257/E21.632
(58) Field of Classification Search .................. 438/303, 438/305, 591, 216, 199, 183; 257/E21.632
See application file for complete search history.

(56) References Cited

U.S. PATENT DOCUMENTS

| 7,160,767 | B2 | 1/2007 | Brask | |
|---|---|---|---|---|
| 7,381,608 | B2 | 6/2008 | Brask | |
| 2006/0071285 | A1* | 4/2006 | Datta et al. | 257/407 |
| 2007/0259499 | A1* | 11/2007 | Eun et al. | 438/270 |
| 2008/0093682 | A1* | 4/2008 | Yao et al. | 257/413 |
| 2008/0258216 | A1* | 10/2008 | Kikuchi | 257/344 |
| 2010/0052074 | A1* | 3/2010 | Lin et al. | 257/407 |
| 2010/0244141 | A1* | 9/2010 | Beyer et al. | 257/369 |

* cited by examiner

*Primary Examiner* — Thanhha Pham
(74) *Attorney, Agent, or Firm* — Winston Hsu; Scott Margo

(57) ABSTRACT

A method for fabricating metal gate transistor is disclosed. The method includes the steps of: providing a substrate, wherein the substrate comprises a transistor region defined thereon; forming a gate insulating layer on the substrate; forming a stacked film on the gate insulating layer, wherein the stacked film comprises at least one etching stop layer, a polysilicon layer, and a hard mask; patterning the gate insulating layer and the stacked film for forming a dummy gate on the substrate; forming a dielectric layer on the dummy gate; performing a planarizing process for partially removing the dielectric layer until reaching the top of the dummy gate; removing the polysilicon layer of the dummy gate; removing the etching stop layer of the dummy gate for forming an opening; and forming a conductive layer in the opening for forming a gate.

15 Claims, 3 Drawing Sheets

METAL GATE TRANSISTOR AND METHOD FOR FABRICATING THE SAME

BACKGROUND OF THE INVENTION

1. Field of the Invention

The invention relates to a method for fabricating transistor, and more particularly, to a method for fabricating metal gate transistor.

2. Description of the Prior Art

In the field of semiconductor fabrication, the use of polysilicon material is diverse. Having a strong resistance for heat, polysilicon materials are commonly used to fabricate gate electrodes for metal-oxide semiconductor transistors. The gate pattern fabricated by polysilicon materials is also used to form self-aligned source/drain regions as polysilicon readily blocks ions from entering the channel region.

However, devices fabricated by polysilicon still have many drawbacks. In contrast to most metal, polysilicon gates are fabricated by semiconductor materials having high resistance, which causes the polysilicon gate to work under a much lower rate than other metal gates. In order to compensate for slightly lowered rate of performance, a significant amount of silicides is applied during the fabrication of polysilicon processes, such that the performance of the device could be increased to an acceptable level.

Gate electrodes fabricated by polysilicon also causes a depletion effect. In most circumstances, the optimum doping concentration for polysilicon is between about $2 \times 20^{20}/cm^3$ and $3 \times 10^{20}/cm^3$. As most gate electrodes have a doping concentration of at least $5 \times 10^{21}/cm^3$, the limited doping concentration of polysilicon gates often results in a depletion region at the interface between the gate and the gate dielectric layer. This depletion region not only thickens the gate dielectric layer, but also lowers the capacitance of the gate and ultimately reduces the driving ability of the device.

In order to resolve this issue, work function metal gates have been developed to replace conventional polysilicon gates. The conventional approach for fabricating metal gates typically forms a dummy gate composed primarily of polysilicon on a substrate, removes the polysilicon material of the dummy gate through dry etching or wet etching, and then deposits a metal into the depleted dummy gate for forming a metal gate.

However, the conventional approach of depleting the polysilicon material from the dummy gate often damages the gate insulating layer underneath. As a result, another thermal oxidation has to be carried out to form another gate insulating layer afterwards. This not only extends the overall fabrication time but also disrupts the distribution of the dopants within the lightly doped drain or source/drain region. Hence, how to effectively resolve the above issue has become an important task.

SUMMARY OF THE INVENTION

It is an objective of the present invention to provide a method for fabricating metal gate transistor for solving the aforementioned problem.

According to a preferred embodiment of the present invention, a method for fabricating metal gate transistor is disclosed. The method includes the steps of: providing a substrate, wherein the substrate comprises a transistor region defined thereon; forming a gate insulating layer on the substrate; forming a stacked film on the gate insulating layer, wherein the stacked film comprises at least one etching stop layer, a polysilicon layer, and a hard mask; patterning the gate insulating layer and the stacked film for forming a dummy gate on the substrate; forming a dielectric layer on the dummy gate; performing a planarizing process for partially removing the dielectric layer until reaching the top of the dummy gate; removing the polysilicon layer of the dummy gate; removing the etching stop layer of the dummy gate for forming an opening; and forming a conductive layer in the opening for forming a gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
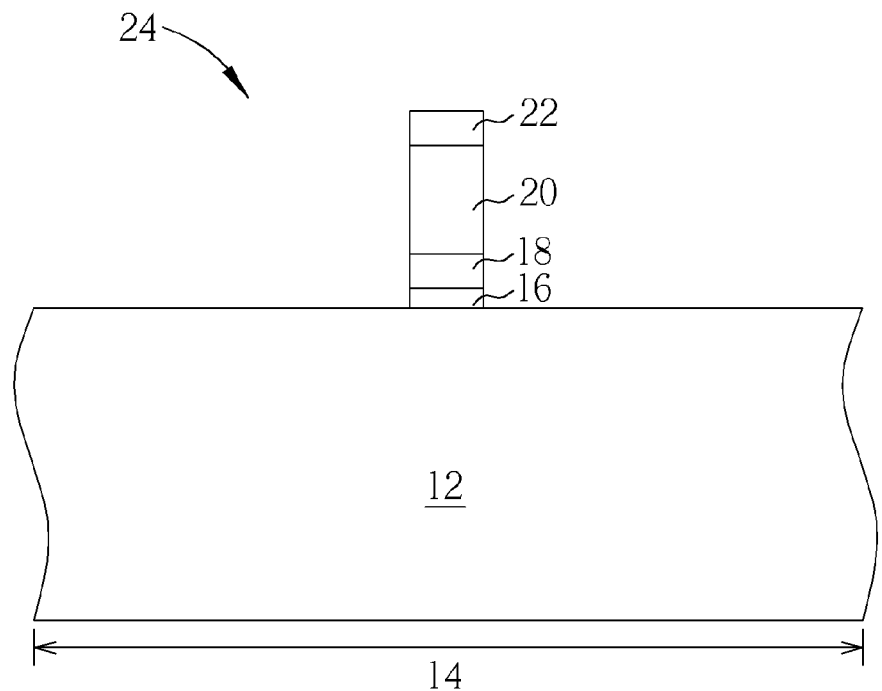
FIGS. 1-5 illustrate a method for fabricating a metal gate transistor according to a preferred embodiment of the present invention.

Referring to FIGS. 1-5, FIGS. 1-5 illustrate a method for fabricating a metal gate transistor according to a preferred embodiment of the present invention. As shown in FIG. 1, a substrate 12, such as a silicon substrate or a silicon-on-insulator substrate is provided, in which at least one transistor region 14 is defined on the substrate 12.

A gate insulating layer (not shown) composed of dielectric material such as oxides or nitrides is then formed on the surface of the substrate 12. According to an embodiment of the present invention, the gate insulating layer could also be composed of pad oxide or a high-k dielectric layer consisting of HfSiO, HfSiON, HfO, LaO, LaAlO, ZrO, ZrSiO, HfZrO, or combination thereof.

A stacked film (not shown) composed of an etching stop layer, a polysilicon layer, and a hard mask is formed on the gate insulating layer. Preferably, the etching stop layer is composed of a silicon nitride layer having a thickness of less than 100 Angstroms, and the polysilicon layer serving as dummy gate layer preferably has a thickness of about 1000 Angstroms. The polysilicon layer could be composed of undoped polysilicon or polysilicon having N+ dopants therein, and the hard mask could be composed of $SiO_2$, silicon nitride, or SiON, which are all within the scope of the present invention.

Next, a patterned photoresist (not shown) is formed on the hard mask, and a pattern transfer is conducted by using the patterned photoresist as mask through single or multiple etching processes to remove a portion of the hard mask, the polysilicon layer, the etching stop layer, and the gate insulating layer. After stripping the patterned photoresist, a dummy gate 24 composed of patterned gate insulating layer 16, patterned etching stop layer 18, patterned polysilicon layer 20, and patterned hard mask 22 is formed on the substrate 12 of the transistor region 14.

Figure 2:
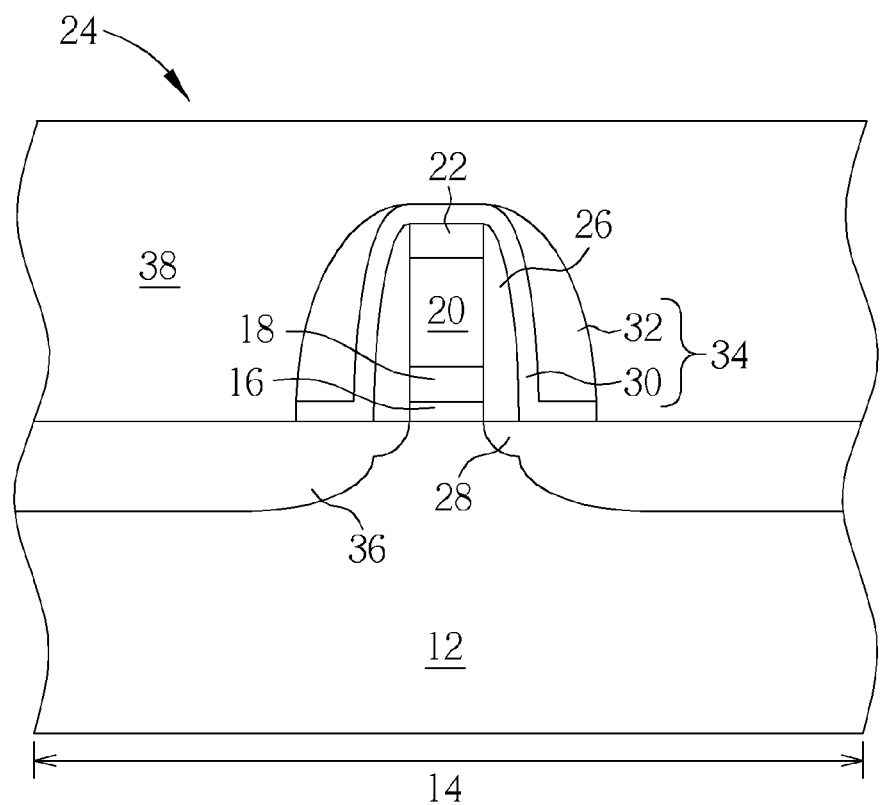

As shown in FIG. 2, a first stage of spacer formation is carried out by first depositing a dielectric layer composed of silicon nitride or both silicon oxide and silicon nitride on the dummy gate 24, and then etching back the deposited dielectric layer to form a first spacer 26 on the sidewall of the dummy gate 24.

Next, a light doping process is performed to form a lightly doped drain. For instance, a patterned photoresist (not shown) is formed on the region outside the transistor region 14, and an ion implantation is carried out by using the patterned photoresist as mask to implant n-type or p-type dopants into the substrate 12 adjacent to two sides of the dummy gate 24 to form a lightly doped drain 28.

Next, a second stage of spacer formation is conducted by sequentially depositing a silicon oxide layer 30 and a silicon nitride layer 32 on the substrate 12 and the dummy gate 24, and then etching back the deposited silicon oxide layer 30 and silicon nitride layer 32 to form a second spacer 34 around the first spacer 26.

Next, a heavy doping process is performed to form a source/drain region. Similar the above approach of forming the lightly doped drain 28, a patterned photoresist (not shown) could be formed on regions outside the transistor region 14, and an ion implantation is carried out by using the patterned photoresist as mask to implant n-type or p-type dopants into the substrate 12 adjacent to two sides of the second spacer 34. After thermally diffusing the implanted dopants, a source/drain region 36 is formed in the substrate 12 adjacent to two sides of the second spacer 34, and the patterned photoresist is stripped thereafter.

Next, a silicon substrate etching back process accompanying a selective epitaxial growth (SEG) process could be performed before or after the formation of the aforementioned source/drain region to form an epitaxial layer (not shown) comprising of silicon and other materials partially in the source/drain region. A salicide process is carried out thereafter to form a silicide layer on the source/drain region 36. As the selective epitaxial growth process and the salicide process are commonly known to those skilled in the art in this field, the details of which are omitted herein for the sake of brevity. Moreover, despite the first spacer, the lightly doped drain, the second spacer, and the source/drain region are formed sequentially in the above embodiment, the order for fabricating the spacers and doping regions could also be adjusted according to the demand of the product, which are all within the scope of the present invention.

Next, an interlayer dielectric layer 38 primarily composed of oxides is formed to cover the entire dummy gate 24. The interlayer dielectric layer 38 could include nitrides, oxides, carbides, low-k dielectric materials, or combination thereof.

Figure 3:
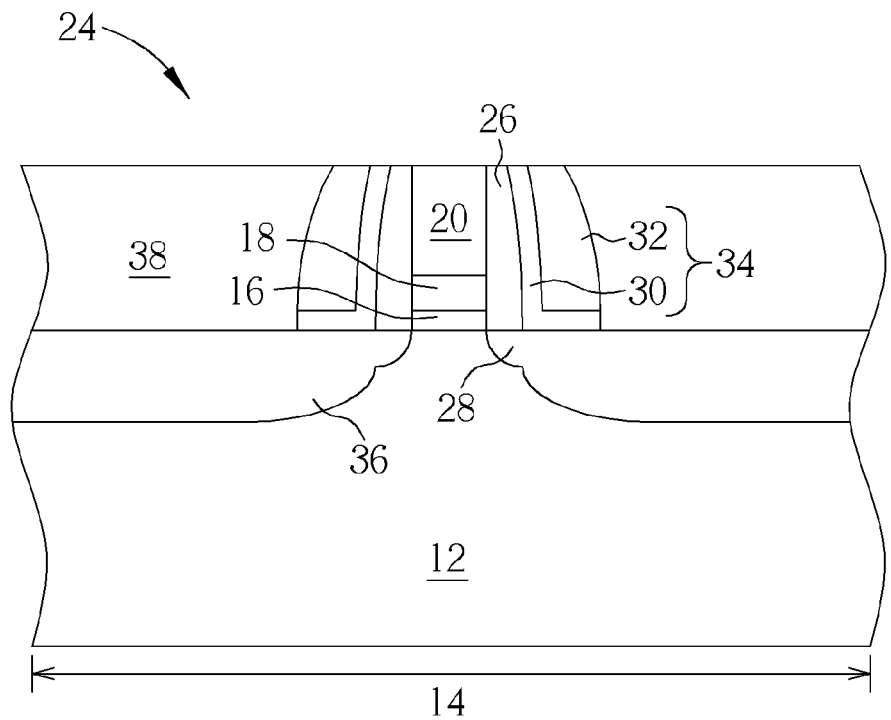

As shown in FIG. 3, a chemical mechanical polishing (CMP) process or a dry etching process is performed to remove a portion of the interlayer dielectric layer 38, part of the first spacer 26, part of the second spacer 34, and the hard mask 22 such that the top of the polysilicon layer 20 is exposed and substantially even with the surface of the interlayer dielectric layer 38.

Figure 4:
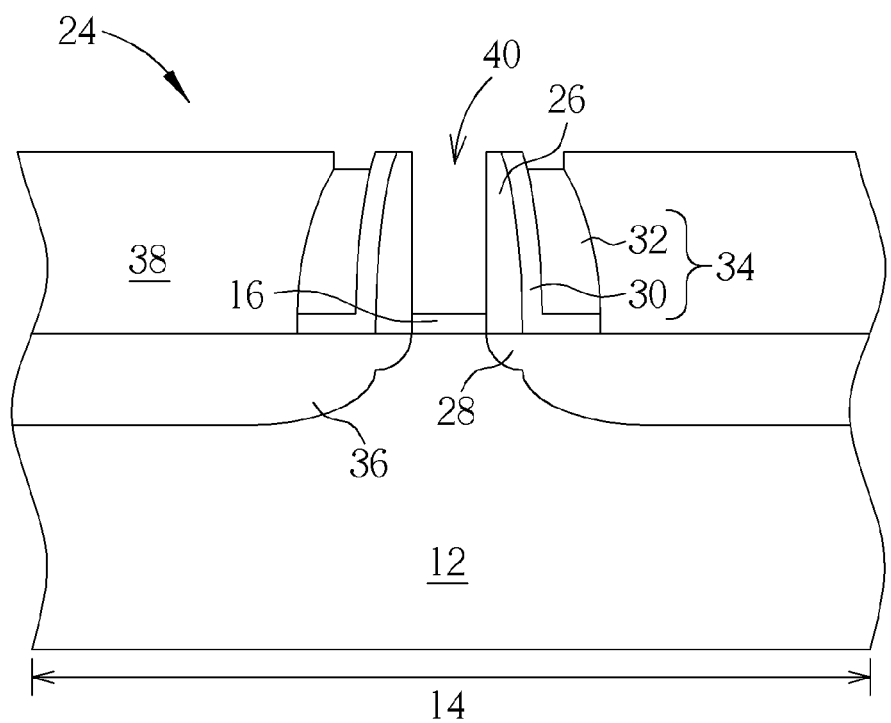

As shown in FIG. 4, a selective dry etching or wet etching process is carried out by using etchant such as $NH_4OH$ or TMAH to empty the polysilicon layer 20 of the dummy gate 24 while stopping on the etching stop layer 18. Next, a wet etching process is performed by using phosphoric acid to remove the etching stop layer 18 composed of silicon nitride. The removal of the etching stop layer 18 preferably forms an opening 40 in the dummy gate 24 while exposing the gate insulating layer 16 underneath.

It should be noted that the present invention preferably forms an etching stop layer 18 composed of silicon nitride between the gate insulating layer 16 and the polysilicon layer 20. This etching stop layer 18 could be used to protect the gate insulating layer 16 by preventing plasma or etchant used during the removal of polysilicon layer 20 from damaging the gate insulating layer 16 underneath as the polysilicon layer 20 is emptied Also, as part of the second spacer 34 is composed of silicon nitride, the present embodiment preferably removes part of the silicon nitride layer 32 of the second spacer 34 while the etching stop layer 18 is removed by the wet etching process, as shown in FIG. 4.

Moreover, as the etching stop layer 18 is preferably composed of silicon nitride, the first spacer 26 is preferably to be fabricated with a material having different etching selectivity from the etching stop layer 18. By doing so, the wet etching process carried out to remove the silicon nitride etching stop layer 18 would not be used to damage the first spacer 26 adjacent to the etching stop layer 18 simultaneously.

Figure 5:
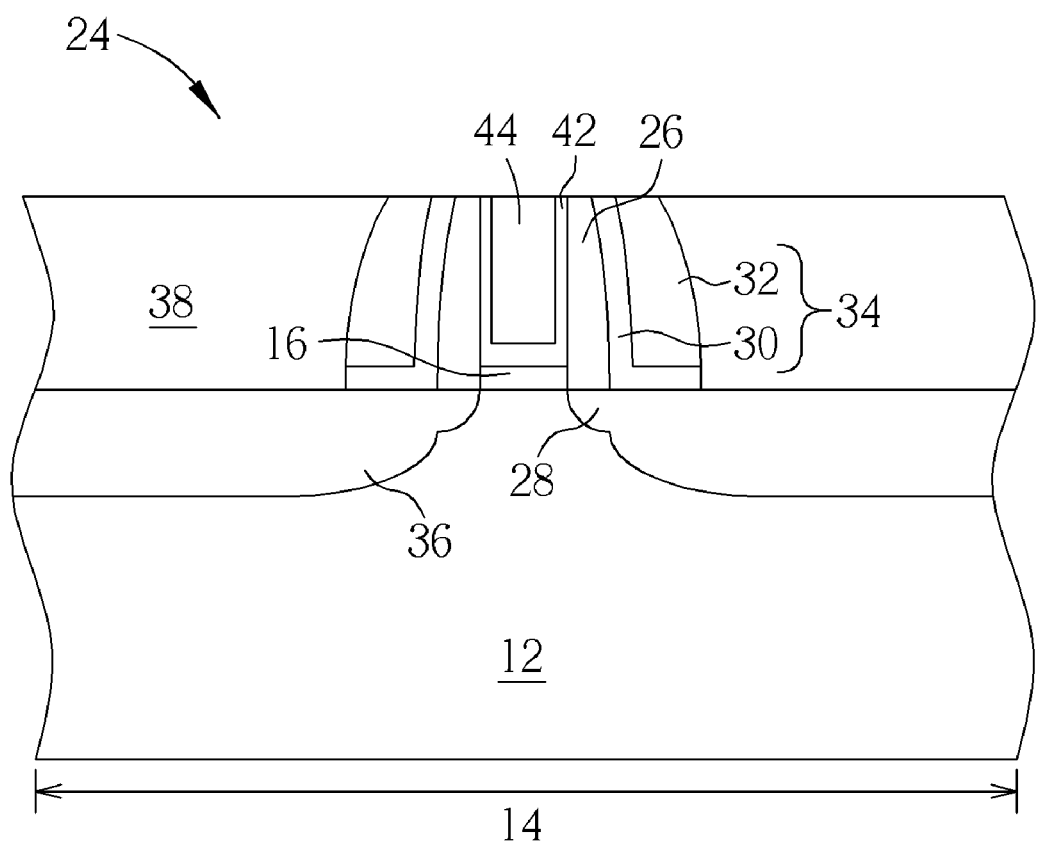

Next, as shown in FIG. 5, a high-k dielectric layer 42 is formed in the opening 40 to cover the gate insulating layer 16, the first spacer 26, the second spacer 34, and the interlayer dielectric layer 38. In this embodiment, the high-k dielectric layer 42 is selected from HfSiO, HfSiON, HfO, LaO, LaAlO, ZrO, ZrSiO, HfZrO, or combination thereof.

Next, a work function metal layer (not shown) could be deposited selectively on the surface of the high-k dielectric layer 42 according to the nature of the transistor. If the transistor fabricated were to be a NMOS transistor, a n-type metal layer could be deposited on the high-k dielectric layer 42, in which the n-type metal layer is selected from a group consisting of TiN, TaC, TaN, TaSiN, and Al. If the transistor fabricated were to be a PMOS transistor, a p-type metal layer could be deposited on the high-k dielectric layer 42, in which the p-type metal layer is selected from a group consisting of TiN, W, WN, Pt, Ni, Ru, TaCN, and TaCNO.

Next, a conductive layer 44 composed of low resistance material is deposited on the high-k dielectric layer 42 and into the opening 40. In this embodiment, the conductive layer 44 is selected from Al, W, TiAl, CoWP, or combination thereof. A chemical mechanical polishing process is conducted thereafter to remove a portion of the conductive layer 44 and high-k dielectric layer 42 on the first spacer 26, second spacer 34, and interlayer dielectric layer 38 to form a metal gate transistor in the transistor region 14.

Overall, the present invention preferably forms an etching stop layer composed of silicon nitride between the gate insulating layer and the dummy polysilicon layer. By doing so, the etching stop layer could be used to protect the gate insulating layer from plasma or etchant used during the removal of polysilicon layer. As the gate insulating layer is protected from damage caused by the removal of the polysilicon layer, the present invention also eliminates the need of conducting an additional thermal oxidation to form another gate insulating layer, thereby reducing overall fabrication time and cost substantially.

Those skilled in the art will readily observe that numerous modifications and alterations of the device and method may be made while retaining the teachings of the invention.

What is claimed is:

1. A method for fabricating a metal gate transistor, comprising:

providing a substrate, wherein the substrate comprises a transistor region defined thereon;

forming a gate insulating layer on the substrate;

forming a stacked film on the gate insulating layer, wherein the stacked film comprises at least one etching stop layer directly contacting the gate insulating layer, a polysilicon layer on the etching stop layer, and a hard mask on the polysilicon layer;

patterning the gate insulating layer and the stacked film for forming a dummy gate on the substrate;

forming a dielectric layer on the dummy gate;

performing a planarizing process for partially removing the dielectric layer until reaching the top of the dummy gate;

removing the polysilicon layer of the dummy gate;

removing the etching stop layer of the dummy gate for forming an opening;

forming a conductive layer in the opening for forming a gate.

2. The method of claim 1, wherein the etching stop layer comprises a silicon nitride layer.

3. The method of claim 1, wherein the etching stop layer comprises a thickness of less than 100 Angstroms.

4. The method of claim 1, wherein the gate insulating layer comprises silicon oxide.

5. The method of claim 1, further comprising forming a first spacer on the sidewall of the dummy gate before forming the dielectric layer, wherein the first spacer and the etching stop layer comprises different etching selectivity.

6. The method of claim 5, wherein the first spacer comprises silicon oxide.

7. The method of claim 5, further comprising forming a lightly doped drain in the substrate adjacent to two sides of the first spacer.

8. The method of claim 7, further comprising forming a second spacer on the sidewall of the first spacer after forming the lightly doped drain.

9. The method of claim 8, further comprising forming a source/drain region in the substrate adjacent two sides of the second spacer.

10. The method of claim 8, wherein the second spacer comprises silicon oxide and silicon nitride.

11. The method of claim 1, further comprising performing a wet etching process for removing the etching stop layer.

12. The method of claim 11, further comprising utilizing phosphoric acid for performing the wet etching process.

13. The method of claim 1, wherein the conductive layer is selected from Al, Co, TiAl, CoWP, or combination thereof.

14. The method of claim 1, further comprising forming a high-k dielectric layer in the opening before forming the conductive layer.

15. The method of claim 14, wherein the high-k dielectric layer comprises HfSiO, HfSiON, HfO, LaO, LaAlO, ZrO, ZrSiO, HfZrO, or combination thereof.

* * * * *